US009310431B2

(12) United States Patent
Liu et al.

(10) Patent No.: US 9,310,431 B2
(45) Date of Patent: Apr. 12, 2016

(54) DIAGNOSIS FRAMEWORK TO SHORTEN YIELD LEARNING CYCLES OF ADVANCED PROCESSES

(75) Inventors: Yen-Ling Liu, Hsinchu (TW); Nan-Hsin Tseng, Tainan (TW); Ji-Jan Chen, Kaohsiung (TW); Wei-Pin Changchien, Taichung (TW); Samuel C. Pan, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 894 days.

(21) Appl. No.: 13/588,155

(22) Filed: Aug. 17, 2012

(65) Prior Publication Data
US 2014/0049281 A1    Feb. 20, 2014

(51) Int. Cl.
*G01R 31/302* (2006.01)
*G01R 31/317* (2006.01)
*G01R 31/3183* (2006.01)
*G01R 31/02* (2006.01)

(52) U.S. Cl.
CPC .. *G01R 31/31704* (2013.01); *G01R 31/318357* (2013.01); *G01R 31/025* (2013.01)

(58) Field of Classification Search
CPC ............... G01R 31/311; G01R 1/0491; G01R 31/31908; G01R 31/318357; H01L 2224/73265
USPC ........................ 324/500, 756.01–758.01, 537, 324/750.01–750.04, 750.15, 750.24; 716/12, 112, 17, 19
See application file for complete search history.

(56) References Cited

U.S. PATENT DOCUMENTS

| 6,744,268 B2 * | 6/2004 | Hollman ................. 324/750.14 |
| 2008/0099762 A1 * | 5/2008 | Garcia et al. ................ 257/48 |
| 2013/0285739 A1 * | 10/2013 | Blaquiere et al. .......... 327/565 |

OTHER PUBLICATIONS

Lavo, David; "Fault Diagnosis Overview", US Santa Cruz, Jan. 13, 2005, p. 1-54.

* cited by examiner

*Primary Examiner* — Melissa Koval
*Assistant Examiner* — Trung Nguyen
(74) *Attorney, Agent, or Firm* — Eschweiler & Associates, LLC

(57) ABSTRACT

The present disclosure relates to a diagnosis framework to shorten yield learning cycles of technology node manufacturing processes from the high defect density stage to technology maturity. A plurality of defect under test (DUT) structures are designed to capture potential manufacturing issues associated with defect formation. A test structure is formed by arranging the DUT structures within a DUT carrier unit, which has been yield-hardened though heuristic yield analysis such that a defect density of the DUT carrier unit is essentially zero. Possible outcomes of an application of test patterns and various failure scenarios associated with defects formed within the DUT structures within the DUT carrier unit are simulated and stored in a look-up table (LUT). The LUT may then be referenced to determine a location of a defect within the test structure without the need for iterative analysis to correctly select defect candidates for physical failure analysis (PFA).

20 Claims, 8 Drawing Sheets

| | 618 | 620 | 622 | 624 | 626 |
|---|---|---|---|---|---|
| 616A | 00000001 | others | 604x, where x = A,I,M,O | 1 | 0 |
| 616B | 00000010 | others | B,I,M,O | 1 | 0 |
| 616C | 00000100 | others | C,J,M,O | 1 | 1 |
| 616D | 00001000 | others | D,J,M,O | 1 | 1 |
| 616E | 00010000 | others | E,K,N,O | 1 | 1 |
| 616F | 00100000 | others | F,K,N,O | 1 | 1 |
| 616G | 01000000 | others | G,L,N,O | 1 | 1 |
| 616H | 10000000 | others | H,L,N,O | 1 | 1 |
| 616I | 10101010 | others | B,D,F,H,I,J,K,L | 0 | 1 |
| 616J | 01010101 | others | A,C,E,G,I,J,K,L | 0 | 1 |

| Pin Group | Fail Patterns (Total:30) | Candidates |
|---|---|---|
| 702 | 1, 8, 21, 22, 28 | Covered by 702 |
| 704 | 2, 3, 10, 12, 13, 14, 15, 24, 25 | Covered by 704 |
| 706 | 1, 4, 10, 14, 18, 20 | Covered by 706 |
| 708 | 2, 3, 8, 8, 11, 15, 18, 25, 28 | Covered by 708 |
| 710 | 4, 8, 13 | Covered by 710 |
| 712 | 21, 23 | Covered by 712 |
| 714 | 0, 9, 13, 14, 23, 25 | Covered by 714, 716 |

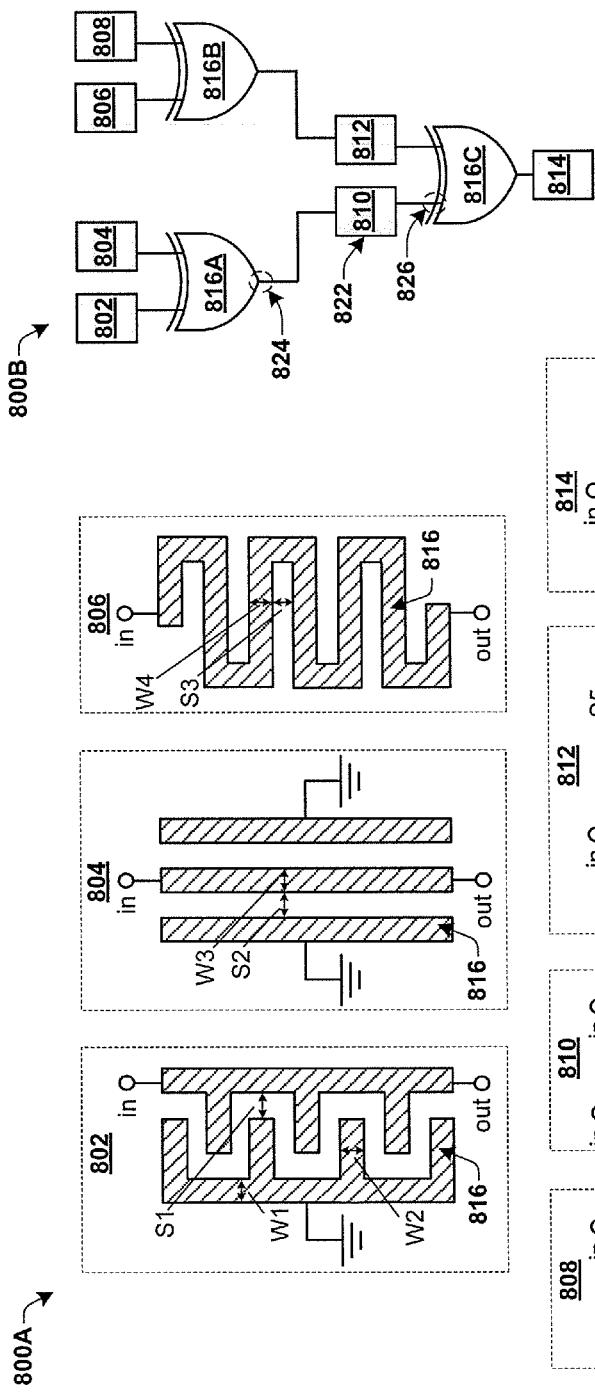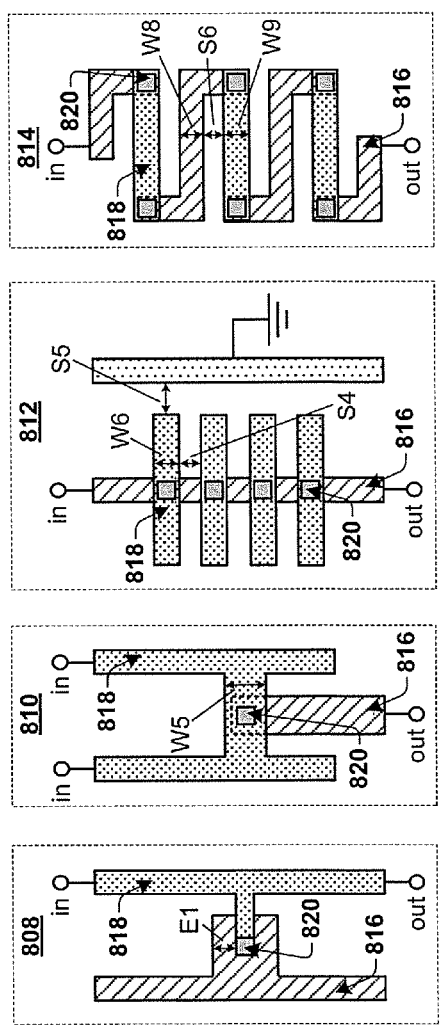
Fig. 8A
Fig. 8B

DIAGNOSIS FRAMEWORK TO SHORTEN YIELD LEARNING CYCLES OF ADVANCED PROCESSES

BACKGROUND

Early technology node manufacturability is limited by yield loss due to high defect densities. Defects can result in immediate yield loss as well as downstream reliability issues. Heuristic yield analysis comprising the application of test patterns to an integrated circuit allows for observation of defects. However, diagnosis of a failure mode associated with a respective defect is a challenge as the location of the defect is difficult to determine. Often physical failure analysis is required to locate a defect and identify a failure mode.

BRIEF DESCRIPTION OF THE DRAWINGS

FIG. 8A illustrates some embodiments of a discrete library of allowable patterns for technology qualification comprising a process sensitive component.

FIG. 8B illustrates some embodiments of a 4-to-1 XOR tree comprising a discrete library of allowable patterns.

DETAILED DESCRIPTION

Figure 1:
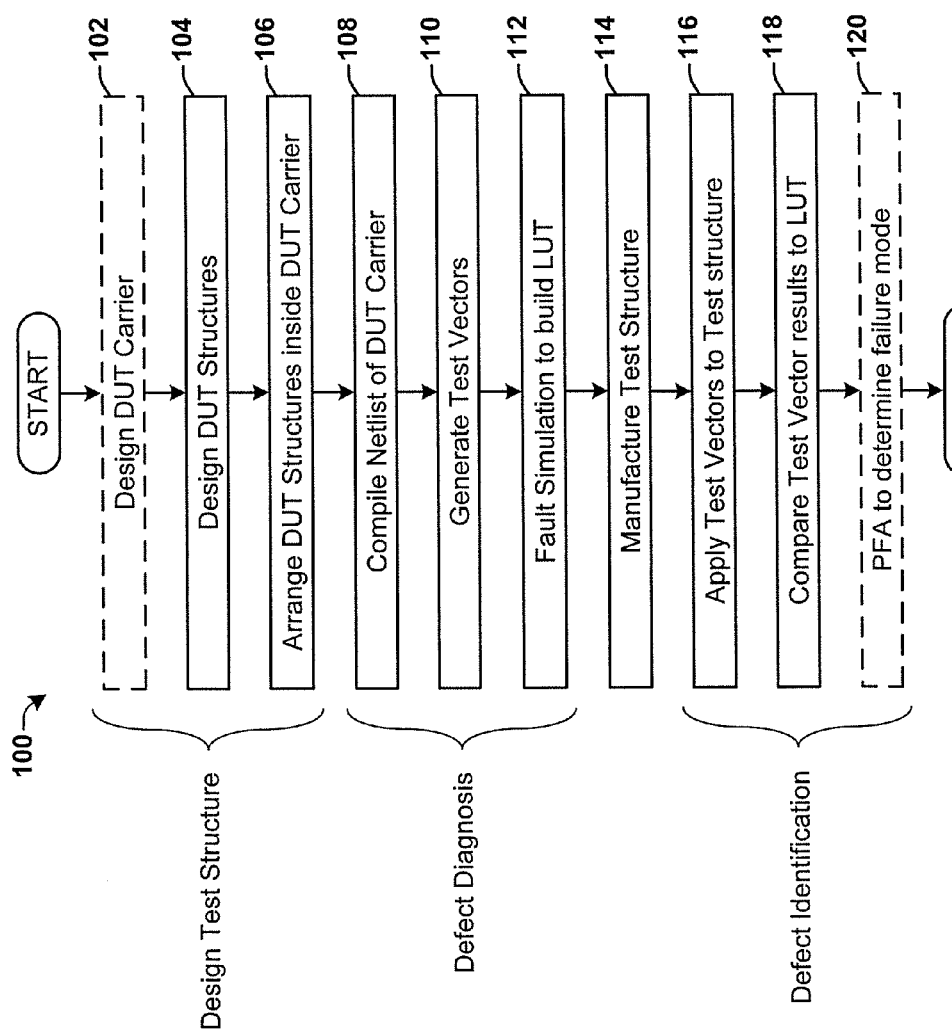
FIG. 1 illustrates a flow diagram of some embodiments of a method to locate and diagnose defects in an integrated circuit.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

Diagnosis of defects in early technology node test vehicles allows for improved yield by determining a failure mode (i.e., root cause) associated with a manufacturing defect, which may be addressed through a change in design, a change in a manufacturing process, or a combination thereof. Current diagnosis methods utilize test patterns to observe defects, and allow for one to draw inferences based on observed behavior which can narrow the search for a failure mode. Typically, physical failure analysis (PFA) is utilized to determine a location and subsequently a failure mode associated with a respective defect. Moreover, several iterations of test pattern application, result interpretation, and making inferences may be necessary to determine a region where PFA may be utilized to determine an exact location and failure mode of a defect. This can limit the overall efficiency in diagnosing all failure modes, which can increase the lead time for product development and mask reliability issues which may only be discovered once a product is in the field. As such, increased efficiency in defect diagnosis is desired.

Accordingly, the present disclosure relates to a diagnosis framework to shorten yield learning cycles of technology node manufacturing processes from a high defect density stage to technology maturity. A plurality of defect under test (DUT) structures are designed to capture potential manufacturing issues associated with defect formation. A test structure is formed by arranging the DUT structures within a defect under test (DUT) carrier unit, which has been yield-hardened though heuristic yield analysis such that a defect density of the DUT carrier unit is essentially zero. Possible outcomes of an application of test patterns and various failure scenarios associated with defects formed within the DUT structures within the DUT carrier unit are simulated and stored in a look-up table (LUT). The LUT may then be referenced to determine a location of a defect within the test structure without the need for iterative analysis to correctly select defect candidates for physical failure analysis (PFA). This diagnosis framework results in a higher resolution and rate of defect detection, shorter yield-ramp times, and optimal test resource.

FIG. 1 illustrates a flow diagram of some embodiments of a method 100 to locate and diagnose defects within an integrated circuit. While method 100 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 102 a reusable defect under test (DUT) carrier unit comprising a plurality of logic devices is designed. The logic devices within the DUT carrier unit have been subjected to heuristic yield analysis comprising manufacture and test of the logic devices to identify defects formed within a respective logic device, physical failure analysis (PFA) to locate the defects and assign a failure mode to a respective defect, and have been yield-hardened through re-design, re-manufacture, and re-test. The heuristic yield analysis may comprise several iterations of re-design, re-manufacture, and re-test to insure robust yield. The DUT carrier unit may be generically designed and reused for an arbitrary collection of DUTs.

At 104 a plurality of DUT structures are designed. A respective DUT structure comprises at least one process sensitive component formed on one or more of a front end of line gate material layer, a middle end of line interconnect layer, or a back end of line metallization layer.

At 106 a test structure if designed by arranging the plurality of DUT structures within the DUT carrier unit, wherein a respective DUT structure forms a connection between an output of a first logic device and an input of a second logic device. The arrangement of the plurality of DUT structures within the DUT carrier unit comprise a logic tree structure, wherein a respective logic device receives its inputs from a plurality of DUTs and sends an output to a single DUT. The test structure is connected to one or more shift registers comprising a plurality of scan registers which are sequentially coupled, and allow for a scan-in of test vectors during testing.

At 108 a netlist comprising a definition of connections between the logic devices within the test structure formed by the plurality of DUT structures is compiled. The netlist may be compiled using an industry-standard extraction tool or an in-house netlist compiler.

At 110 a plurality of test vectors are generated for the test structure. A respective test vector comprises a multi-bit binary test vector which serves as an input to the test structure, and may be generated through utilization of an automatic test pattern generation (ATPG) tool to mimic a manufacturing defect within the test structure.

At 112 expected outputs of applying the plurality of test vectors to the test structure are simulated to define possible failure locations within the test structure. The simulations may be performed using an industry-standard a fault simulation tool or design for test (DFT) tool, and are stored in a look-up table (LUT).

At 114 the test structure is manufactured, which comprises fabrication of a silicon-based early technology yield learning vehicle in the 20 nm technology node, the 14 nm technology node, or lower technology node.

At 116 the plurality test vectors are applied to the test structure to generate measured outputs. Application of the plurality test vectors comprises multi-bit binary test vectors scanned-in through a first shift register, operated on by the logic devices within the test structure to generate the measured outputs, which are then scanned out through a second shift register.

At 118 the measured outputs are compared to the expected outputs to determine a failure location within the test structure, which comprises locating the stuck bits within the LUT.

At 120 physical failure analysis (PFA) may be performed to the test structure at the failure location as defined by the LUT to determine a failure mode (e.g., an open, a short, etc.). The failure mode may be cataloged for future reference. Note that PFA is not necessary to determine the location of the fail as that is determined by the look-up table. Moreover, PFA need not be performed if the failure mode has already been identified and cataloged.

Figure 2:
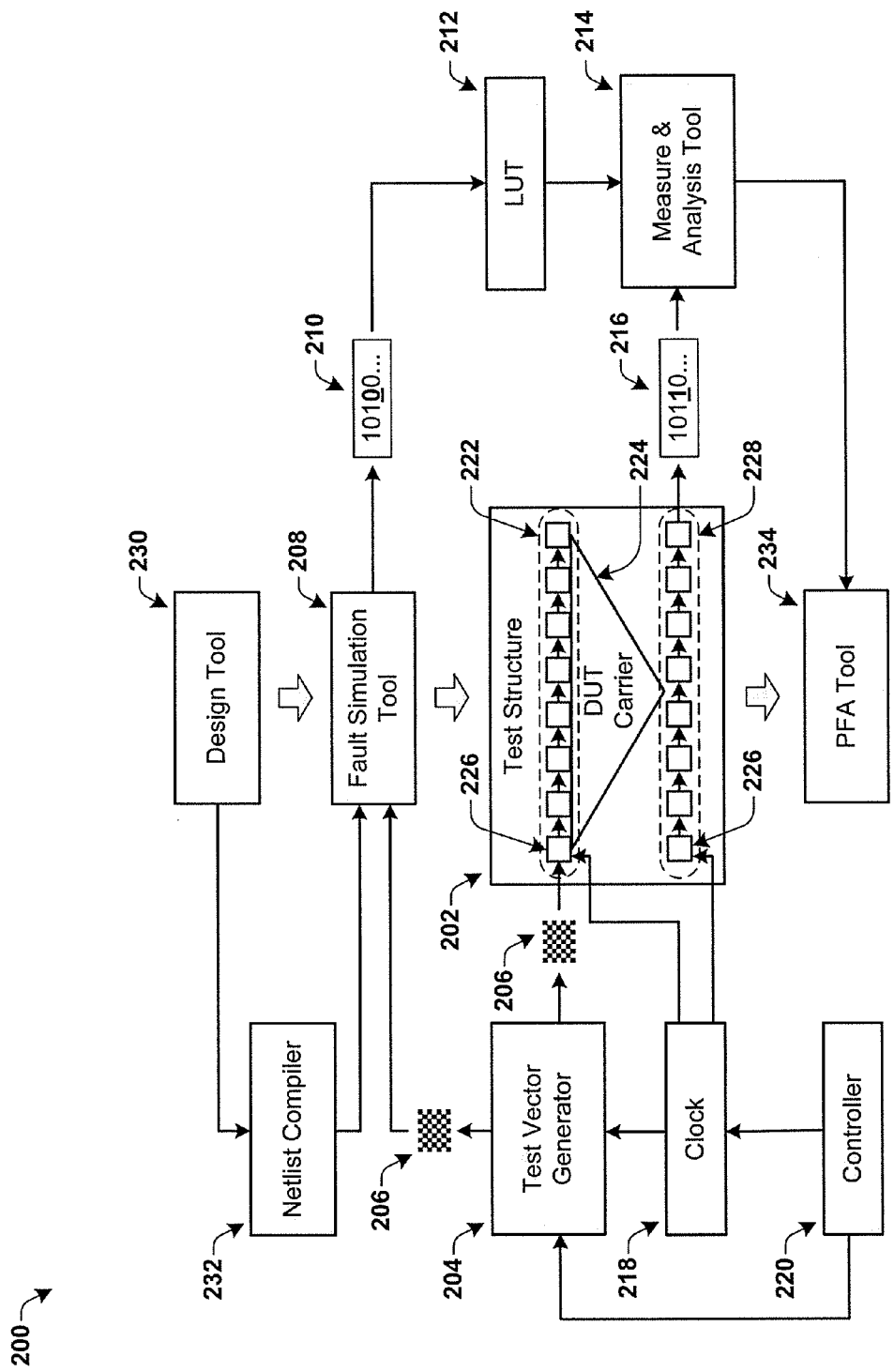
FIG. 2 illustrates some embodiments of a tool arrangement configured to locate and diagnose defects in an integrated circuit.

FIG. 2 illustrates some embodiments of a tool arrangement 200 configured to locate and diagnose defects in an integrated circuit. A test vector generator 204 is configured to define a test vector 206 corresponding to a test structure 202. A fault simulation tool 208 is configured to receive the test vector 206 from the test vector generator 204 and to simulate an expected output 210 of applying the test vector 206 to the test structure 202 which corresponds to a failure location within the test structure 202. A look-up table (LUT) 212 is configured to receive the expected output 210 from the fault simulation tool 208 and to store the expected output 210 for reference. A measurement and analysis tool 214 is configured to receive a measured output 216 of applying the test vector 206 to the test structure 202, and to compare the measured output 216 to the expected output 210 to determine a failure location within the test structure 202 without performing physical failure analysis (PFA).

The test structure 202 comprises a first shift register 222 which is controlled by a clock 218 and configured to receive the test vector 206 from the test vector generator 204. A controller 220 is configured to control operation of the test vector generator 204 and the clock 218. The first shift register 222 comprises a plurality of scan registers 226 which are sequentially coupled and configured to receive the test vector 206 comprising a multi-bit binary vector as a serial data string and distribute the test vector 206 in parallel format to a DUT carrier unit 224. A second shift register 228 which is controlled by the clock 218 is configured to receive a measured output 216 from the DUT carrier unit, and to send the measured output 216 to the measurement and analysis tool 214. The second shift register 228 comprises a plurality of scan registers 226 which are sequentially coupled and configured to receive the measured output 216 from the DUT carrier unit 224 as a single bit, and to distribute the measured output 216 to a measurement and analysis tool 214. The second shift register 228 may also receive multiple measured outputs 216 and distribute the multiple measured outputs 216 as a serial data string to a measurement and analysis tool 214.

The DUT carrier unit 224 comprises a plurality of logic devices which are coupled by a plurality of DUT structures to form a logic tree for which a known input (e.g., the test vector 206) will produce an expected output 210. It will be appreciated in subsequent embodiments that through heuristic yield analysis and PFA to identify and correct defects that the first shift register 222, the second shift register 228, and the plurality of logic devices within the test structure 202 may be yield-hardened such that defect formation is limited to the DUT structures. It will be further appreciated that a structure of the logic tree will allow for the expected output 210 to be used to determine a location of a defect corresponding to DUT structure.

Before the test structure 202 can be tested it must first be designed and manufactured. A design tool 230 is configured to produce a design of the test structure 202, and is coupled to a netlist compiler 232 configured to receive information about the design of the test structure 202 and to compile a netlist of the connections formed between the plurality of logic devices. The netlist compiler 232 is further configured to send the netlist to the fault simulation tool 208 in order to simulate the expected output 210.

It will be appreciated that the structure of the logic tree within the test structure 202 allows for the expected output 210 to determine a location of a defect (e.g., a defective DUT) within the test structure 202 when compared to the measured output 216 in the measurement and analysis tool 214. Knowledge of the location of the defect may be sufficient for many testing applications. However, it may also be useful to assign a failure mode (i.e., a root cause of the failure) by subjecting the test structure 202 to destructive physical failure analysis (PFA) in a PFA tool 234. While in some prior art approaches PFA is utilized as a component to aid in determination the location of the defect, the measurement and analysis tool 214 of the tool arrangement 200 can determine the location without PFA by utilizing the look-up table 212 to compare the expected output 210 to the measured output 216.

Figure 3:
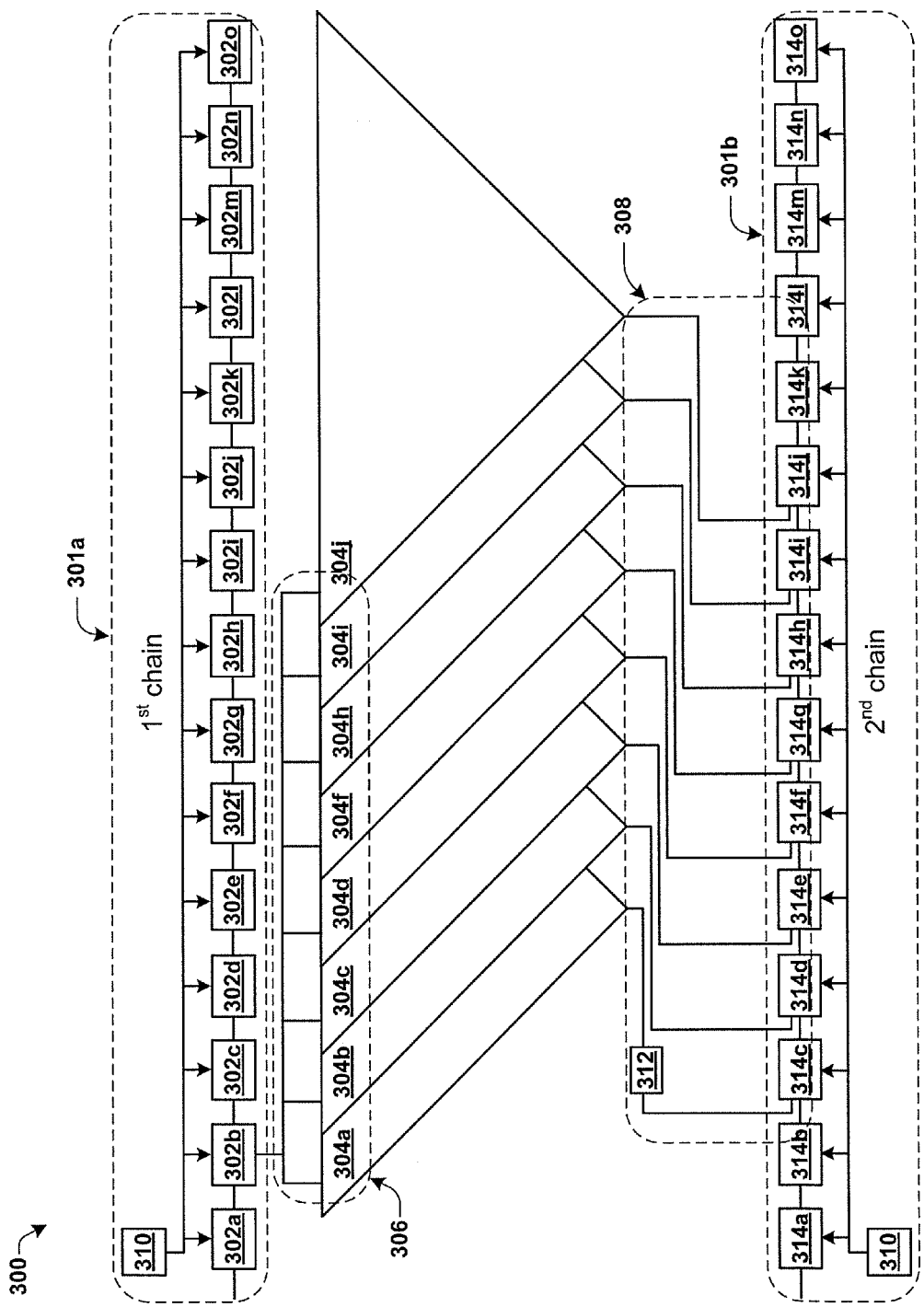
FIG. 3 illustrates some embodiments of a yield learning circuit structure.

FIG. 3 illustrates some embodiments of a yield learning circuit structure 300, comprising a first shift register 301a, a second shift register 301b, and a plurality of defect under test (DUT) carrier units 304a-304j, wherein a respective DUT carrier unit of the plurality of DUT carrier units 304a-304j comprises a plurality of logic devices arranged in a logic tree structure which has been yield-hardened. The first shift register 301a comprises a plurality of first scan registers 302a-302o which are sequentially coupled, wherein a respective first scan register of the plurality of first scan registers 302a-302o is connected to N DUT carrier units of the plurality of DUT carrier units 304a-304j. For the embodiments of a yield learning circuit structure 300 a respective DUT carrier unit of the plurality of DUT carrier units 304a-304j comprises an 8-to-1 XOR tree with 8 inputs and 1 output (i.e., N=8). Each output of a respective DUT carrier unit of the plurality of DUT carrier units 304a-304j is connected to a respective second scan register of a plurality of second scan registers 314a-314o of the second shift register 301b, which selects an input source according to mode selection signal 310.

Each second scan register 314a-314o comprises two data inputs. A first input of a respective second scan register of the plurality of second scan registers 314a-314o is connected to an output of a respective DUT carrier unit of the plurality of DUT carrier units 304a-304j. A second input of a respective second scan register of the plurality of second scan registers 314a-314o is connected to an output of a previous second scan register of the plurality of second scan registers 314a-314o (i.e., a second input of scan register 314o is connected to an output of scan register 314n, etc.). The first shift register 301a and the second shift register 301b each comprise two operation modes: a shift mode and a capture mode, which are controlled by a mode selection signal 310. As a non-limiting example, in shift mode (mode selection signal=1), all second scan registers of the plurality of second scan registers 314a-314o form a shift register between a primary input and a primary output, and each second scan register of the plurality of second scan registers 314a-314o will receive an output value of a preceding second scan register of the plurality of second scan registers 314a-314o. In capture mode (mode selection signal=0), each second scan register of the plurality of second scan registers 314a-314o will change to receive the output value of a respective DUT carrier unit of the plurality of DUT carrier units 304a-304j.

For a yield learning circuit structure 300 comprising M DUT carrier units 304a-304j, the first shift register 301a will require M first scan registers of the plurality of first scan registers 302a-302o, and the second shift register 301b will each require M second scan registers of the plurality of second scan registers 314a-314o. As a non-limiting example, for an 8-input first DUT carrier unit 304a, output data 312 of the first 8 first scan registers 302a-302j are connected to 8 inputs of the first DUT carrier unit 304a, outputs of the 2nd through 9th first scan registers 302b-302k are connected to the 8 inputs of the second DUT carrier unit 304b, and so on. On the output side, an output (312) of the first DUT carrier unit 304a is connected to a first input of second scan register 314c, an output of a second DUT carrier unit 304b is connected to a first input of second scan registers 314d, and so on.

Figure 4:
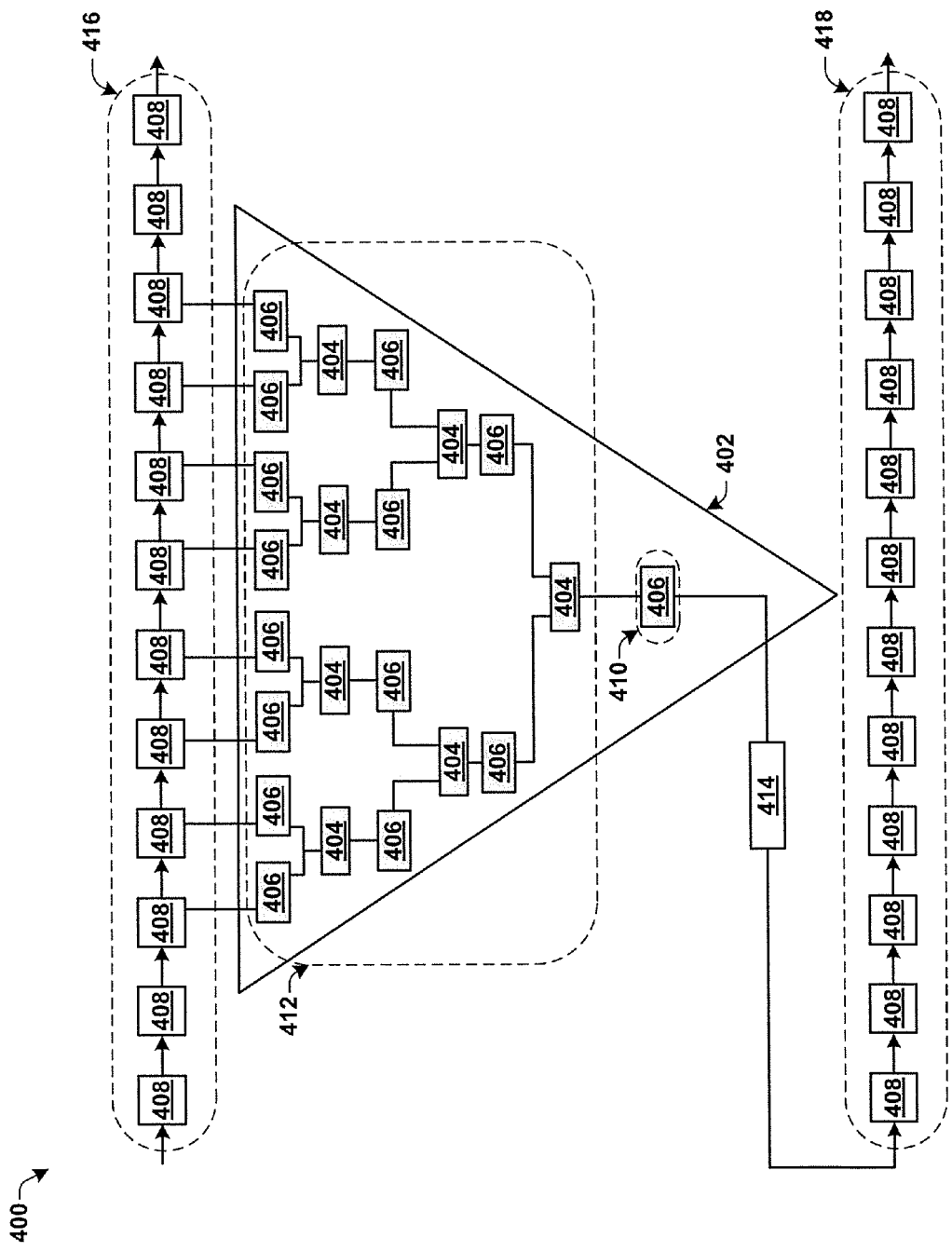
FIG. 4 illustrates some embodiments of a yield learning circuit structure.

FIG. 4 illustrates some embodiments of a yield learning circuit structure 400, comprising a defect under test (DUT) carrier unit 402 which comprises a plurality of logic devices 404 arranged in a logic tree structure, wherein a respective logic device 404 has been yield-hardened through heuristic yield analysis and physical failure analysis (PFA) to identify and correct defects within the DUT carrier unit 402. The DUT carrier unit 402 comprises a plurality of DUT structures 406, a respective DUT structure 406 comprising at least one process sensitive component which comprises a connection between respective logic devices 404 within the logic tree structure. The logic tree structure further comprises a final DUT structure 410 which outputs a measured value 414 of the yield learning circuit structure 400. The final DUT structure 410 receives an input from an interior logic tree 412, wherein a respective logic device 404 receives one or more inputs from a plurality of DUT structures 406 (i.e., respective logic device 404 has two inputs, one each from a respective DUT structure 406, but in general may have three or more inputs). The interior logic tree 412 receives an input test vector (not shown) from first a shift register 416 comprising a plurality of scan registers 408 which are sequentially coupled and configured to receive the test vector as a serial data string and distribute the test vector in parallel format to the DUT carrier unit 402.

The serial data string comprises a multi-bit binary vector. A respective logic device 404 within the interior logic tree performs a logic operation (e.g., AND, OR, NAND, XOR, etc.) on one or more bits of the multi-bit binary vector. The yield learning circuit structure 400 sends the measured output 414 from the DUT carrier unit 402 as a single output bit through a second shift register 418 comprising a plurality of scan registers 408 which are sequentially coupled to a measurement and analysis tool. The second shift register 418 may also receive multiple output bits corresponding to multiple input test vectors, and distribute the multiple output bits as a serial data string to a measurement and analysis tool.

Figure 5:
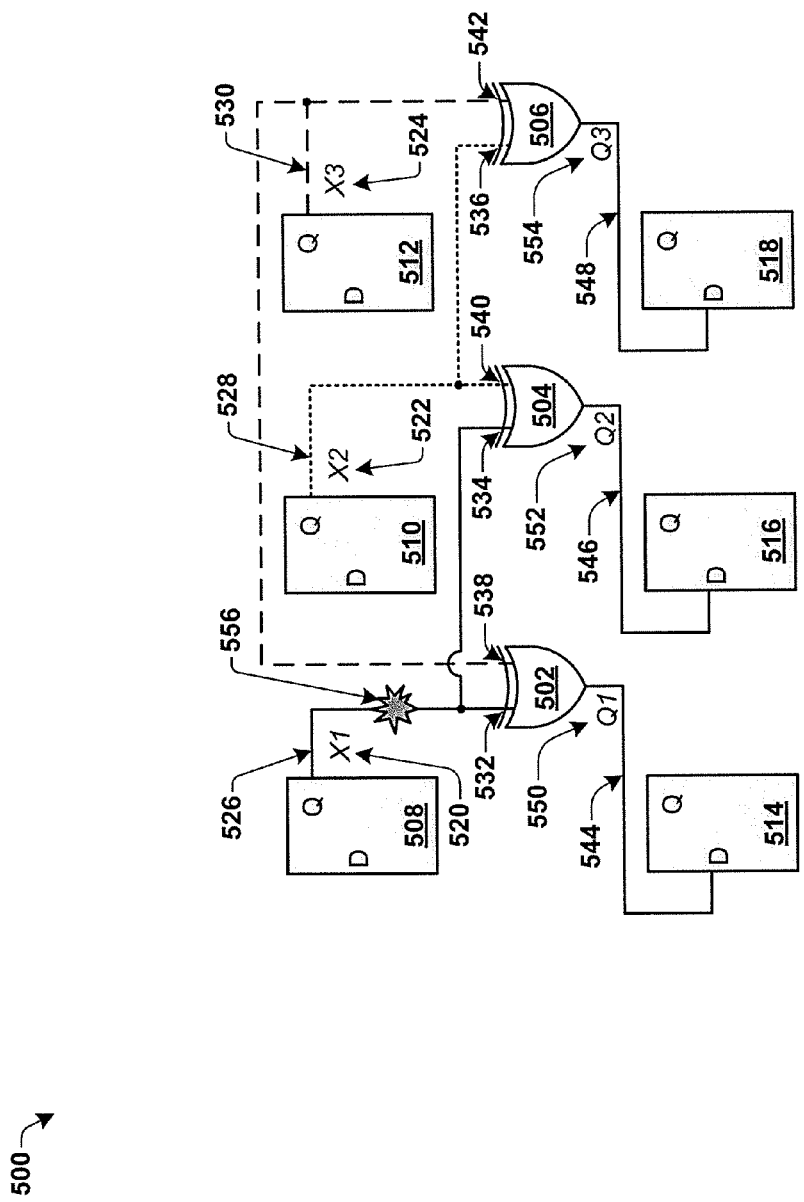
FIG. 5 illustrates some embodiments of a DUT carrier circuit.

FIG. 5 illustrates some embodiments of a DUT carrier circuit 500, comprising logic devices which comprise a first XOR gate 502, a second XOR gate 504, and a third XOR gate 506. A first output signal X1 520 of a first scan register 508 is carried along a first connection 526, which is coupled to a first input 532 of the first XOR gate 502 and a first input 534 of the second XOR gate 504. A second output signal X2 522 of a second scan register 510 is carried along a second connection 528, which is coupled to a second input 540 of the second XOR gate 504 and a first input 536 of the third XOR gate 506. A third output signal X3 of a third scan register 512 is carried along a third connection 530, which is coupled to a second input 538 of the first XOR gate 502 and a second input 542 of the third XOR gate 506. A fourth output signal Q1 550 of the first XOR gate 502 is carried along a fourth conducting path 544 which is coupled to a fourth scan register 514. A fifth output signal Q2 552 of the second XOR gate 504 carried along a fifth conducting path 546 which is coupled to a fifth scan register 516. A sixth output signal Q3 554 of the third XOR gate 506 is carried along a sixth conducting path 548 which is coupled to a sixth scan register 518.

To determine possible locations of defects that may form within a respective DUT coupled to the DUT carrier circuit 500, a netlist comprising a definition of all connections between devices within the DUT carrier circuit 500 may be defined. The connections, as described in the previous paragraph, may defined generally for any set of N DUT carrier circuit 500 by an N×N connectivity matrix which defines the inputs of the respective XOR gates of the DUT carrier circuit 500, which operates on said inputs to produce expected outputs:

$$\begin{bmatrix} XOR \\ (N \times N) \end{bmatrix} \times \begin{bmatrix} \text{Inputs} \\ (N \times 1) \end{bmatrix} = \begin{bmatrix} \text{Outputs} \\ (N \times 1) \end{bmatrix}.$$

For the DUT carrier circuit 500 there are N=3 connections. Therefore, the above operation becomes:

$$\begin{bmatrix} 1 & 0 & 1 \\ 1 & 1 & 0 \\ 0 & 1 & 1 \end{bmatrix} \times \begin{bmatrix} X1 \\ X2 \\ X3 \end{bmatrix} = \begin{bmatrix} Q1 \\ Q2 \\ Q3 \end{bmatrix},$$

which gives:

$Q1 = X1 + X3 \Rightarrow Q1 = \text{xor}(X1, X3)$ $Q2 = X1 + X2 \Rightarrow Q2 = \text{xor}(X1, X2)$ $Q3 = X2 + X3 \Rightarrow Q3 = \text{xor}(X2, X3)$ Therefore, for the inputs X1, X2, and X3 comprising values of 0 or 1, the outputs Q1, Q2, and Q3 comprising values of 0 or 1 are fully-determined for the DUT carrier circuit 500 by the connectivity matrix and function of the logic devices. This allows for simulation of expected outputs when applying the inputs X1, X2, and X3.

In this exemplary embodiment of the DUT carrier circuit 500, a defect 556 is introduced in the DUT carrier circuit 500 which causes the value of X1 to become "stuck" at 1. As a result, an input test vector of (X1,X2,X3)=(0,1,1) would give an expected output of:

$$\begin{bmatrix} 1 & 0 & 1 \\ 1 & 1 & 0 \\ 0 & 1 & 1 \end{bmatrix} \times \begin{bmatrix} 0 \\ 1 \\ 1 \end{bmatrix} = \begin{bmatrix} 1 \\ 1 \\ 0 \end{bmatrix},$$

but because X1 is stuck at 1, a measured output is:

$$\begin{bmatrix} 1 & 0 & 1 \\ 1 & 1 & 0 \\ 0 & 1 & 1 \end{bmatrix} \times \begin{bmatrix} 1 \\ 1 \\ 1 \end{bmatrix} = \begin{bmatrix} 0 \\ 0 \\ 0 \end{bmatrix}.$$

The measured output (Q1,Q2,Q3)=(0,0,0) can be anticipated by modifying the input test vector to (X1,X2,X3)=(1,1,1).

Therefore, applying a test vector to the DUT carrier circuit 500 to generate the measured output, and comparing the expected output to the measured output allows for identification of a defect. Since the connectivity matrix (e.g., netlist) and the function of the logic devices comprising the DUT carrier circuit 500 are known, the result of any combination of values for the input test vector (X1,X2,X3) can be simulated and stored (i.e., similar to a look-up table), thus allowing one to determine a respective failure-location within the DUT carrier circuit 500 without the need for destructive failure analysis. Moreover, the first XOR gate 502, second XOR gate 504, and third XOR gate 506 of the DUT carrier circuit 500 comprise first through third DUT carrier units respectively, wherein a respective carrier unit comprises a 2-to-1 XOR tree. Note that the size of the DUT carrier circuit 500 is scalable and extendable. For example, an 8×8 connectivity matrix to describe connectivity of a DUT carrier unit comprising an 8-to-1 XOR tree may be derived by a similar analysis. The embodiments of a DUT carrier circuit 500 can be used to understand the basic diagnosis concepts and matrix construction of a netlist. In general this analysis can be extended to a DUT carrier circuit with an arbitrary number of connections.

Figures 6A, 6B:
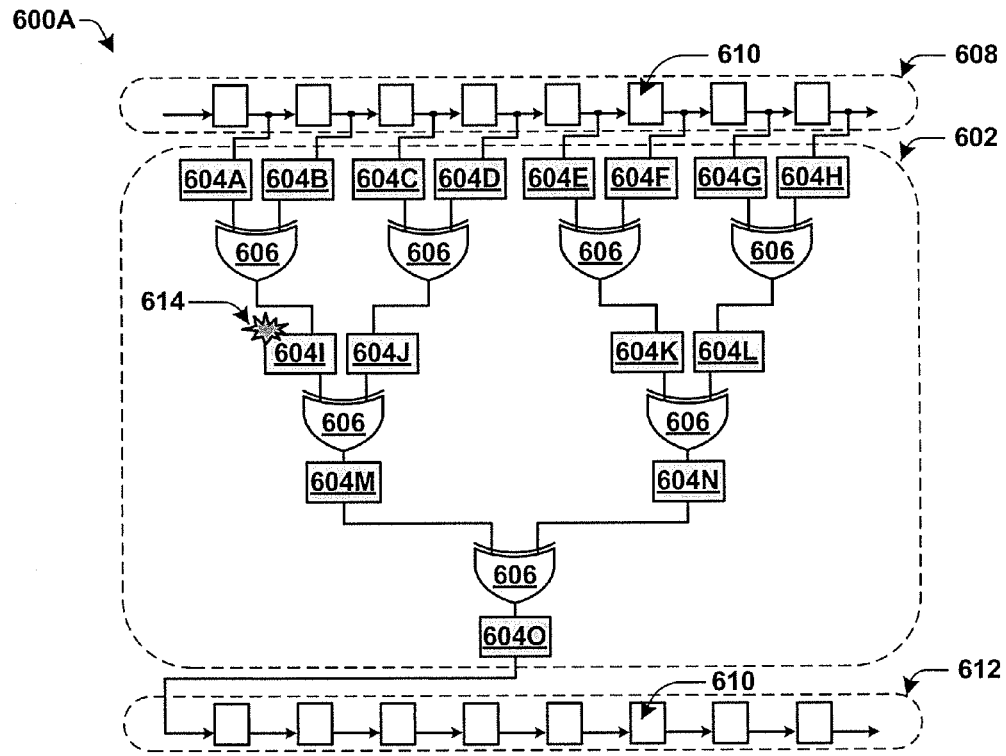
FIG. 6A illustrates some embodiments of a DC yield learning circuit structure.
FIG. 6B illustrates some embodiments of a look-up table comprising expected vs. simulated results

FIG. 6A illustrates some embodiments of a DC yield learning circuit structure 600A, comprising an 8-to-1 XOR tree 602 configured to carry 15 DUT structures 604A-604O. A respective DUT structure from the 15 DUT structures 604A-604O of the 8-to-1 XOR tree 602 comprises a connection between an output of a first XOR gate 606 and an input of a second XOR gate 606, wherein each XOR gate 606 is coupled to two DUT structures from the 15 DUT structures 604A-604O which form input connections to the XOR gate 606. A first shift register 608 delivers a test vector (not shown) comprising an 8-bit binary vector to the 8-to-1 XOR tree 602. The first shift register 608 comprises a plurality of scan registers 610 which are sequentially coupled and configured to receive the test vector as a serial data string and distribute the test vector in parallel format to the to the 8-to-1 XOR tree 602. A second shift register 612 comprising a plurality of scan registers 610 is configured to receive a measured output from DUT 604O as a single measured output bit (not shown) for a respective input 8-bit binary vector.

The 8-to-1 XOR tree 602 of FIG. 6A will produce an expected output for a given input test vector. A measured output that differs from the expected output is therefore due to a defect 614 (e.g., an open or short) in one or more of the DUT structures 604A-604O within the DC yield learning circuit structure 600A. Possible measured outputs may be simulated for a given input for a variety of defects formed within the DC yield learning circuit structure 600A, and their results stored in a look-up table for use in identifying a location of the defect 614.

FIG. 6B illustrates some embodiments of a look-up table 600B comprising expected outputs 624 vs. simulated results 626 for various input test vectors 616A-616J from a collection of test vectors 618 to the DC yield learning circuit structure 600A. For a respective test vector 616A-616J, an expected output 624 that differs from a corresponding simulated result 626 may be observed as a stuck-at 1 bit which comprises a value of 1 for any test vector 616A-616J, or a stuck-at 0 bit which comprise a value of 0 for any test vector 616A-616J. Stuck-at 0 bits corresponding to test vectors 616A-616J may be observed in stuck-at 0 defect candidates 622 comprising a subset of the DUT structures 604A-604O. Stuck-at 1 defect candidates 620 also comprise a subset of the DUT structures 604A-604O (i.e., marked as "others"), and comprise the remaining subset of DUT structures 604A-604O other than those shown in column 622 for a respective test vector 616A-616J. For example, for test vector 616A the "others" (620) comprise 604*x*, where x=B,C,D,E,F,G,H,J,K,L,N. For either stuck-at 1 defect candidates 620 or stuck-at 0 defect candidates 622, an exact location (e.g., a failing DUT) may be identified by applying a plurality of input test vectors 616A-616J wherein the expected output 624 differs from the simulated result 626 until a single common failing DUT is identified. Note that for the embodiments of the look-up table 600B a respective stuck-at 0 defect candidate 622 comprising a letter x=A-O which corresponds to a given DUT structure 604*x* of FIG. 6A.

For the embodiments of the look-up table 600B corresponding to the DC yield learning circuit structure 600A, wherein DUT 604I has been compromised due to the defect 614, the test vector 616A produces an expected output 624 of 1, but a simulated result 626 of 0. Therefore, one or more of DUT structures 604A, 604I, 604M, and 604O are stuck at 0, or one or more of DUT structures 604B, 604C, 604D, 604E, 604F, 604G, 604H, 604J, 604K, and 604N are stuck at 1. Test vector 616B produces an expected output 624 of 1, but a simulated result 626 of 0 for stuck-at 0 DUTs 604B, 604I, 604M, and 604O, or stuck at 1 DUTs 604A, 604C, 604D, 604E, 604F, 604G, 604H, 604J, 604K, and 604N. Test vector 616I produces an expected output 624 of 0, but a simulated result 626 of 1 for stuck-at 0 DUTs 604B, 604D, 604F, 604H, 604I, 604J, 604K, and 604L, or stuck-at 1 DUTs 604A, 604C, 604E, 604G, 604M, 604N, and 604O. Test vector 616J produces an expected output 624 of 0, but a simulated result 626 of 1 for stuck-at 0 DUT structures 604A, 604C, 604E, 604G, 604I, 604J, 604K, and 604L, or stuck-at 1 DUTs 604B, 604D, 604F, 604H, 604M, 604N, and 604O. Comparison of these four results for a common stuck-at 0 622 DUT results in DUT 604I, and for a common stuck-at 1 620 DUT results in no DUT (because all 626 results are considered). Therefore, DUT 604I has been identified containing the defect 614.

The DC yield learning circuit structure 600A and corresponding look-up table 600B comprise some embodiments of a device and method to identify and locate DC fails within the DC yield learning circuit structure 600A. Stuck-at 0 bits comprise a structure that has become shorted to ground or an open has formed due to a manufacturing defect. Stuck-at 1 bits comprise a structure that has become shorted to $V_{DD}$ due to a manufacturing defect. Stuck-at 0 bits and stuck-at 1 bits comprise stuck-at fault bits which can be identified in DC testing. Failure modes identified during DC testing comprise hard fails that are not related to timing (e.g., frequency) and can reduce yield. However, soft fail mechanisms may only be identified during AC testing, comprising defects related to timing. Coupling faults, wherein changing a state of a first DUT changes the state of a second DUT, and transition faults, wherein a DUT fails to undergo a 0 1 or a 1 0 transition are two examples of soft fails which may only be identified during AC testing. Pattern sensitive faults are of particular interest in lower technology nodes due to limitations in current lithographic tools in resolving two-dimensional features on a technology-minimum pitch.

Figures 7A, 7B:
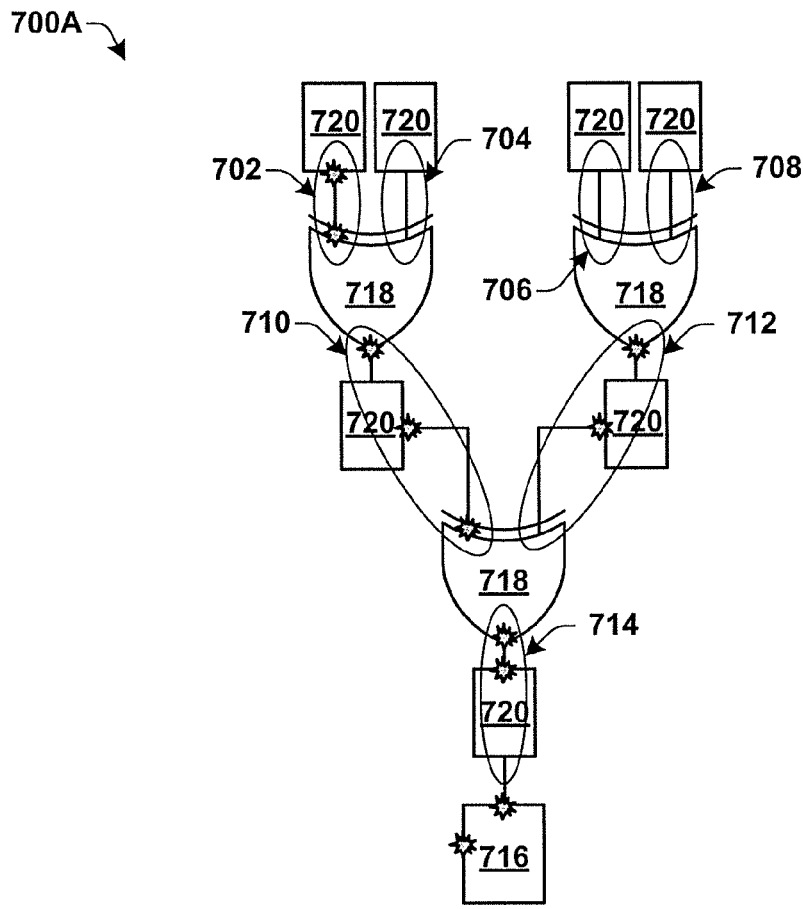
FIG. 7A illustrates some embodiments of an AC yield learning circuit structure.
FIG. 7B illustrates some embodiments of an AC look-up table.

FIG. 7A illustrates some embodiments of an AC yield learning circuit structure 700A, comprising a plurality of XOR gates 718 which have been yield-hardened though heuristic yield analysis. The plurality of XOR gates 718 comprise a logic tree structure with connections formed by a plurality of DUTs 720. AC testing comprising transition testing may be performed at speed to detect transition violations resulting from crosstalk in the AC yield learning circuit structure 700A resulting from node nets which are coupled. Crosstalk increases signal delay and can cause transition violations that can't be detected at DC frequencies (i.e., these cannot be detected in a stuck-at fault test). AC testing can also be used to detect faults resulting from defects which impact rise and fall times, set-up and hold times, and delay and access times at product application speeds.

FIG. 7B illustrates some embodiments of an AC look-up table 700B comprising an index of failing AC patterns 724B which may be utilized to locate an AC fault observed within a respective pin group 702-714, or output pin 716 of FIG. 7A, resulting from a measured output that differs from an expected output.

FIG. 8A illustrates some embodiments of a discrete library of allowable patterns 800A for technology qualification comprising seven elements: a one-layer comb structure 802, a one-layer spacing structure 804, a one-layer serpentine structure 806, a multi-layer interconnect structure 808, a multi-layer bridge structure 810, a multi-layer shorting structure 812, and a multi-layer serpentine structure 814. It will be appreciated that these exemplary embodiments of the discrete library of allowable patterns 800A comprise a non-limiting example for the purpose of understanding, and that additional patterns may also be included into the discrete library of allowable patterns 800A.

A respective pattern 802-814 of the discrete library of allowable patterns 800A comprises a process sensitive component comprising a lithographic sensitive pattern formed on a via interconnect layer, one or more back end of line metallization layers, or a combination thereof. It will be appreciated that a lithographic sensitive pattern comprises a pattern of features formed on a layer which may or may not be resolvable by one or more lithographic tools which manufactures the layer. Examples of lithographic sensitive patterns include but are not limited to: two-dimensional features on a technology-minimum pitch, subminimum feature sizes, or multiple vias formed at or below technology-minimum space. These patterns may be manufactured and qualified through heuristic yield analysis. Moreover, one or more parameters associated with a layout characteristic of a respective pattern may be varied systematically to gauge an impact on yield (e.g., width, space, etc.) and establish a lower-bound on the parameter for manufacturability.

The one-layer comb structure 802 is formed on a first metallization layer 816 comprising a spine width W1, and comb width W2, and a comb space S1. The spine width W1 and comb width W2 may be systematically varied to create an open within the one-layer comb structure 802. The comb space S1 may be systematically varied to create to create a short to ground. The one-layer spacing structure 804 is formed on a first metallization layer 816 comprising a strip width W3 which may be systematically varied to create an open, and a metal space S2 which may be systematically varied to create to create a short to ground. The one-layer serpentine structure 806 is formed on a first metallization layer 816 comprising a serpentine width W4 and serpentine space S3 which may be systematically varied to create an open. These one-layer patterns 802-806 may be utilized to gauge failure modes associated with a resolution of one or more lithographic tools or processes. Other failure modes associated with manufacturing multiple metallization layers for lithographic tools or processes, or other manufacturing components may also be gauged by utilizing multi-layer patterns 808-814 from the discrete library of allowable patterns 800A.

The multi-layer interconnect structure 808 is formed on a first metallization layer 816, and a second metallization layer 818, with a via 820 that forms a connection between the first metallization layer 816 and the second metallization layer 818. A setback E1 of the via 820 within the first metallization layer 816 may be systematically varied to create an open. The multi-layer bridge structure 810 is formed on a first metallization layer 816, and a second metallization layer 818, with a via 820 that forms a connection between the first metallization layer 816 and the second metallization layer 818. A bridge width W5 of a wrong-way segment of the second metallization layer 818 may be systematically varied to create an open. The multi-layer shorting structure 812 is formed on multiple segments of a first metallization layer 816 and a on multiple segments of second metallization layer 818, with a plurality of vias 820 forming various connections between the first metallization layer 816 and the second metallization layer 818. A finger width W6 of horizontal segments formed on the second metallization layer 818, a first finger space S4 between horizontal segments formed on the second metallization layer 818, and a second finger space may all be systematically varied to create an open or short within the multi-layer shorting structure 812. The multi-layer serpentine structure 814 is formed on multiple segments of a first metallization layer 816 and a on multiple segments of second metallization layer 818, with a plurality of vias 820 forming various connections between the first metallization layer 816 and the second metallization layer 818. The multi-layer serpentine structure 814 comprises a first metallization layer serpentine width W8, a second metallization layer serpentine width W9, and a serpentine space S6 which may be systematically varied to create an open. Additionally, a setback (not shown) of one or more vias 820 within the first metallization layer 816 or the second metallization layer 818 may also be systematically varied to create an open.

FIG. 8B illustrates some embodiments of a 4-to-1 XOR tree 800B comprising a plurality of XOR gates 816A-816C and the discrete library of allowable patterns 800A. A respective element of discrete library of allowable patterns 800A forms a connection between an output of a first XOR gate and an input of a second XOR gate as demonstrated by a connection 822 formed by the multi-layer bridge structure 810 between an output 824 of XOR gate 816A and an input 826 of XOR gate 816C. A netlist of the 4-to-1 XOR tree 800B may be derived, and multi-bit test vectors may be written (i.e., 4-bit test vectors) and simulated to establish a look-up table (LUT) of expected outputs. The LUT may then be utilized to compare a measured output to an expected output when applying a respective test pattern and systematically varying one or more of the elements of the discrete library of allowable patterns 800A which form connections between the XOR gates 816A-816C of the 4-to-1 XOR tree 800B, allowing for to determination that a respective element has developed a defect. Note that in general for a discrete library of 2n−1 of allowable patterns, an n-to-1 XOR tree may be utilized to qualify each pattern.

It will also be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein; such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, the present disclosure relates to a diagnosis framework to shorten yield learning cycles of technology node manufacturing processes from high defect density stage to technology maturity. A plurality of defect under test (DUT) structures are designed to capture potential manufacturing issues associated with defect formation. A test structure is formed by arranging the DUT structures within a DUT carrier unit, which has been yield-hardened though heuristic yield analysis such that a defect density of the DUT carrier unit is essentially zero. Possible outcomes of an application of test patterns and various failure scenarios associated with defects formed within the DUT structures within the DUT carrier unit are simulated and stored in a look-up table (LUT). The LUT may then be referenced to determine a location of a defect within the test structure without the need for iterative analysis to correctly select defect candidates for physical failure analysis (PFA). This diagnosis framework results in a higher resolution and rate of defect detection, shorter yield-ramp times, and optimal test resource.

In some embodiments the present disclosure relates to a method to locate and diagnose defects in an integrated circuit. A reusable defect under test (DUT) carrier unit is designed comprising a plurality of logic devices. A plurality of DUT structures are designed, wherein a respective DUT structure comprises at least one process sensitive component. A test structure is designed by arranging the plurality of DUT structures within the DUT carrier unit such that a respective DUT structure forms a connection between an output of a first logic device and an input of a second logic device (e.g., a logic tree). An expected output is simulated for a defect formed within the test structure, and stored in a look-up table (LUT). Heuristic yield analysis is applied to the test structure to identify the defect within the test structure. The look-up table is then utilized to locate the defect without performing time-consuming physical yield analysis (PFA).

In some embodiments the present disclosure relates to a tool arrangement configured to locate and diagnose defects in an integrated circuit. A test vector generator is configured to define a test vector corresponding to a test structure. A fault simulation tool is configured to receive the test vector from the test vector generator and to simulate an expected output of applying the test vector to the test structure which corresponds to a failure location within the test structure. A look-up table is configured to receive the expected output from the fault simulation tool and to store the expected output. A measurement and analysis tool is configured to receive a measured output from applying the test vector to the test structure, and to compare the measured output to the expected output to determine a failure location within the test structure without performing physical failure analysis (PFA). A failure mode associated may either be determined through PFA or referenced from an earlier result.

In some embodiments the present disclosure relates to a yield learning circuit structure comprising a defect under test (DUT) carrier unit and DUT structures. The DUT carrier unit comprises a plurality of logic devices arranged in a logic tree structure, wherein a respective logic device has been yield-hardened through heuristic yield analysis and physical failure analysis (PFA) to identify and correct defects within the DUT carrier unit. A respective DUT structure comprises at least one process sensitive component which comprises a connection between an output of a first logic device and an input of a second logic device within the logic tree structure. One of more parameters associated with the process sensitive component may be varied systematically within the DUT structure to gauge an impact on yield and establish a lower-bound on the parameter for manufacturability.

What is claimed is:

1. A method to locate and diagnose defects in an integrated circuit, comprising:
designing a plurality of DUT structures within a defect under test (DUT) carrier unit, wherein a respective DUT structure comprises at least one process sensitive component;
designing a test structure by arranging the plurality of DUT structures within the DUT carrier unit, wherein a respective DUT structure forms a connection between an output of a first logic device and an input of a second logic device;
simulating an expected output for a defect within the test structure, and storing the expected output in a look-up table (LUT);
applying heuristic yield analysis to the test structure to identify the defect within the test structure; and
utilizing the LUT to locate the defect without performing physical yield analysis (PFA).

2. The method of claim 1, wherein a respective logic device within the DUT carrier unit has been yield-hardened through heuristic yield analysis and PFA to identify and correct defects.

3. The method of claim 1, further comprising:
generating a multi-bit binary test vector for the test structure;
compiling a netlist of the test structure, the netlist comprising a definition of connections between logic devices within the test structure formed by the plurality of DUT structures; and
simulating an expected output of applying the multi-bit binary test vector to the test structure along the connections formed by the DUT structures to define a possible failure location within the test structure.

4. The method of claim 3, further comprising:
applying the test vector to the test structure to generate a measured output; and
comparing the expected output stored in the LUT to the measured output to determine a failure location within the test structure.

5. The method of claim 4, wherein comparing an expected output to the measured output comprises:
obtaining the measured output comprising an output binary vector describing one or more connections of the test structure;
locating the output binary vector in the LUT; and
determining the failure location comprising a connection within the test structure by identifying a location corresponding to a failing bit in the output binary vector.

6. The method of claim 1, further comprising:
performing PFA to the test structure at a failure location as defined by the LUT to determine a failure mode; and
cataloging the failure mode for future reference.

7. The method of claim 1, further comprising:
arranging a plurality of logic devices within the DUT carrier unit to form a logic tree structure, wherein a respective connection formed between the output of the first logic device and the input of the second logic device comprises at least one process sensitive component within a respective DUT structure.

8. The method of claim 7, wherein the process sensitive component comprises a lithographic sensitive pattern formed on one or more of a front end of line gate material layer, a middle end of line interconnect layer, of back end of line metallization layer.

9. The method of claim 8, further comprising qualifying a discrete library of 2n−1 allowable patterns through use of an n-to-1 XOR tree.

10. A tool arrangement configured to locate and diagnose defects in an integrated circuit, comprising:
a test vector generator configured to define a test vector corresponding to a test structure;
a fault simulation tool configured to receive the test vector from the test vector generator and to simulate an expected output of applying the test vector to the test structure which corresponds to a failure location within the test structure;
a look-up table (LUT) configured to receive the expected output from the fault simulation tool and to store the expected output; and
a measurement and analysis tool configured to receive a measured output of applying the test vector to the test structure, and to compare the measured output to the expected output to determine the failure location within the test structure without performing physical failure analysis (PFA).

11. The tool arrangement of claim 10, further comprising:
a clock configured to control application of the test vector to the test structure;
a controller configured to control operation of the test vector generator and the clock;
a design tool configured to produce a design of the test structure; and
a netlist compiler configured to receive information about the design of the test structure, to compile a netlist of connections between a plurality of logic devices within the test structure, and to send the netlist to the fault simulation tool to simulate the expected output.

12. The tool arrangement of claim 10, the test structure comprising:
a first shift register controlled by a clock and configured to receive the test vector from the test vector generator;
a defect under test (DUT) carrier unit comprising a plurality of logic devices and a plurality of DUT structures, wherein a respective DUT structure forms a connection between an output of a first logic device and an input of a second logic device; and
a second shift register controlled by the clock and configured to receive a measured output from the DUT carrier unit, and to send the measured output to the measurement and analysis tool.

13. The tool arrangement of claim 10, further comprising a physical failure analysis (PFA) tool configured to receive the failure location from the measurement and analysis tool and assign a failure mode to the failure location.

14. The tool arrangement of claim 10, further comprising:
a clock configured to control application of the test vector to the test structure; and
a controller configured to control operation of the test vector generator and the clock.

15. A yield learning circuit structure, comprising:
a defect under test (DUT) carrier unit comprising a plurality of logic devices arranged in a logic tree structure having a final DUT structure which outputs a measured value of the yield learning circuit structure, and an interior logic tree comprising a second plurality of logic devices, wherein a respective logic device of the interior logic tree receives one or more inputs from a plurality of DUT structures, and sends its output to a single DUT structure; and
wherein a respective one of the plurality of DUT structures comprises at least one process sensitive component which comprises a connection between an output of a first logic device and an input of a second logic device within the logic tree structure.

16. The yield learning circuit structure of claim 15, further comprising a shift register comprising a plurality of scan registers which are sequentially coupled and configured to receive a test vector as a serial data string and distribute the test vector in parallel format to the DUT carrier unit.

17. The yield learning circuit structure of claim 16, wherein the shift register is configured to receive a measured output from the DUT carrier unit and to distribute the measured output as a serial data string to a measurement and analysis tool.

18. The yield learning circuit structure of claim 15, wherein a respective logic device comprises one or more logic gates.

19. The yield learning circuit structure of claim 15, wherein the process sensitive component comprises a lithographic sensitive pattern formed on one or more of a front end of line gate material layer, a middle end of line interconnect layer, of back end of line metallization layer.

20. The yield learning circuit structure of claim 15, wherein a respective logic device has been yield-hardened through heuristic yield analysis and physical failure analysis (PFA) to identify and correct defects within the DUT carrier unit.

* * * * *